(12) United States Patent
Nakatsuka et al.

(10) Patent No.: US 11,527,115 B2
(45) Date of Patent: Dec. 13, 2022

(54) CONTROL DEVICE, CONTROL UNIT, CONTROL METHOD, AND STORAGE MEDIUM

(71) Applicant: HONDA MOTOR CO., LTD., Tokyo (JP)

(72) Inventors: Makoto Nakatsuka, Wako (JP); Satoru Otsuka, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 868 days.

(21) Appl. No.: 16/424,549

(22) Filed: May 29, 2019

(65) Prior Publication Data

US 2020/0013245 A1 Jan. 9, 2020

(30) Foreign Application Priority Data

Jul. 3, 2018 (JP) .............................. JP2018-127062

(51) Int. Cl.
*G07C 5/08* (2006.01)
*G05D 1/00* (2006.01)
*G06F 30/34* (2020.01)

(52) U.S. Cl.
CPC .......... *G07C 5/0816* (2013.01); *G05D 1/0088* (2013.01); *G06F 30/34* (2020.01); *G05D 2201/0213* (2013.01)

(58) Field of Classification Search
CPC .... G07C 5/0816; G06F 30/34; G05D 1/0088; G05D 2201/0213
USPC .......................................................... 434/65
See application file for complete search history.

(56) References Cited

U.S. PATENT DOCUMENTS

| 1,348,269 A | * | 8/1920 | Costigan ................ A21C 11/16 222/287 |
|---|---|---|---|
| 10,361,802 B1 | * | 7/2019 | Hoffberg-Borghesani .................. G06F 3/00 |
| 11,353,335 B1 | * | 6/2022 | Brandmaier ........... G01C 21/20 |
| 2008/0195274 A1 | | 8/2008 | Morozumi |
| 2011/0307142 A1 | | 12/2011 | Yanagi et al. |

(Continued)

FOREIGN PATENT DOCUMENTS

| CN | 105892934 | 8/2016 |
| CN | 108068818 | 5/2018 |

(Continued)

OTHER PUBLICATIONS

Japanese Office Action for Japanese Patent Application No. 2018-127062 dated Oct. 12, 2021.

(Continued)

*Primary Examiner* — Yazan A Soofi
(74) *Attorney, Agent, or Firm* — Amin, Turocy & Watson, LLP

(57) ABSTRACT

A control device including: a determination unit that determines whether or not a malfunction has occurred in a monitoring target on the basis of a state of the monitoring target; an arithmetic unit that is capable of reconfiguring a function; a storage unit that stores software used for causing the arithmetic unit to reconfigure a function relating to an operation of the monitoring target; and a processing unit that reads the software from the storage unit and reflects the software on the arithmetic unit in a case in which it is determined by the determination unit that a malfunction has occurred in the monitoring target.

17 Claims, 11 Drawing Sheets

(56) References Cited

U.S. PATENT DOCUMENTS

| | | | | |
|---|---|---|---|---|
| 2019/0364492 A1* | 11/2019 | Azizi | .................... | H04W 4/029 |
| 2020/0389469 A1* | 12/2020 | Litichever | ............. | H04L 63/029 |
| 2022/0180003 A1* | 6/2022 | Tehranipoor | .......... | G06F 21/554 |

FOREIGN PATENT DOCUMENTS

| | | |
|---|---|---|
| JP | 2000-081991 | 3/2000 |
| JP | 2001-136058 | 5/2001 |
| JP | 2006-107532 | 4/2006 |
| JP | 6189004 | 8/2017 |

OTHER PUBLICATIONS

Sakata, et al. Processing continuation technology in the event of a failure due to dynamic reconfiguration of hardware and software implemented in high-level synthesis, IEICE Technical Report [online], Japan, The Institute of Electronics, Information and Communication Engineers (IEICE), May 24, 2018, vol. 118, No. 63, pp. 13-18.

Chinese Office Action for Chinese Patent Application No. 201910529269.1 dated May 7, 2022.

* cited by examiner

| FUNCTION | PRIORITY RANKING | USAGE RATIO (%) |
|---|---|---|
| FUNCTION A | 1 | 40 |
| FUNCTION B | 2 | 35 |
| FUNCTION C | 3 | 15 |
| FUNCTION D | 4 | 10 |

| FUNCTION | PRIORITY RANKING | USAGE RATIO (%) |
|---|---|---|
| FOF | - | 50 |
| FUNCTION A | 1 | 30 |
| FUNCTION B | 2 | 15 |
| FUNCTION C | 3 | 4 |
| FUNCTION D | 4 | 1 |

FIG. 7

| FUNCTION | FIRST PRIORITY LEVEL | USAGE RATIO (%) | STATUS |
|---|---|---|---|
| FUNCTION A | HIGH | 15 | Inactive |
| FUNCTION B | HIGH | 55 | Active |
| FUNCTION C | INTERMEDIATE | 20 | Inactive |
| FUNCTION D | LOW | 10 | Active |

FIG. 8

| FUNCTION | FIRST PRIORITY LEVEL | USAGE RATIO (%) | STATUS |
|---|---|---|---|
| FOF | – | 50 | Active |
| FUNCTION A | HIGH | 5 | Inactive |
| FUNCTION B | HIGH | 40 | Active |
| FUNCTION C | INTERMEDIATE | 0 | Inactive |
| FUNCTION D | LOW | 5 | Active |

FIG. 10

| FUNCTION | SECOND PRIORITY LEVEL |
|---|---|
| FOF FUNCTION 1 | HIGH |
| FOF FUNCTION 2 | LOW |

FIG. 11

| FUNCTION | USAGE RATIO (%) | FIRST PRIORITY LEVEL |
|---|---|---|
| FUNCTION A | 70 | HIGH |
| FUNCTION B | 15 | LOW |
| FUNCTION C | 10 | LOW |
| FUNCTION D | 5 | LOW |

FIG. 12

| FUNCTION | USAGE RATIO (%) | FIRST PRIORITY LEVEL |
|---|---|---|
| FUNCTION A | 70 | HIGH |
| FOF FUNCTION 1 | 20 | - |
| FUNCTION B | 10 | LOW |
| FUNCTION C | 0 | LOW |
| FUNCTION D | 0 | LOW |

FIG. 13

| FUNCTION | USAGE RATIO (%) | FIRST PRIORITY LEVEL |
|---|---|---|
| FOF FUNCTION 1 | 40 | - |
| FOF FUNCTION 2 | 30 | - |
| FUNCTION B | 15 | LOW |
| FUNCTION C | 10 | LOW |
| FUNCTION D | 5 | LOW |

CONTROL DEVICE, CONTROL UNIT, CONTROL METHOD, AND STORAGE MEDIUM

CROSS-REFERENCE TO RELATED APPLICATION

Priority is claimed on Japanese Patent Application No. 2018-127062, filed Jul. 3, 2018, the content of which is incorporated herein by reference.

BACKGROUND

Field of the Invention

The present invention relates to a control device, a control unit, a control method, and a storage medium.

Description of Related Art

Conventionally, technologies relating to devices (arithmetic units) being able to be reconfigured which are represented by a field programmable gate array (FPGA) have been disclosed (for example, Japanese Unexamined Patent Application Publication No. 2001-136058). In a technology disclosed in Patent Document 1, necessity/non-necessity of avoidance of a malfunction is determined on the basis of malfunction information and logic circuit data present on an FPGA, and, in a case in which malfunction avoidance is necessary, the function of a malfunctioning part is substituted with a spare part of the FPGA, and a partial change is applied to received logic circuit data, and logic circuit data used for avoiding a malfunction is generated.

However, in the conventional technology, it is premised that a spare area of a logic circuit is prepared in advance, and there is a likelihood that preferred malfunction avoidance will not be performed in a case in which a spare part of resources is insufficient.

An aspect of the present invention is realized in consideration of such situations, and one object thereof is to provide a control device, a control unit, a control method, and a storage medium that realize a function dedicated for responding to a malfunction only when a malfunction occurs using a flexible structure of an arithmetic unit that can be reconfigured.

SUMMARY OF THE INVENTION

A control device, a control unit, a control method, and a storage medium according to the present invention employ the following configurations.

(1): According to one aspect of the present invention, there is provided a control device including: a determination unit that determines whether or not a malfunction has occurred in a monitoring target on the basis of a state of the monitoring target; an arithmetic unit that is capable of reconfiguring a function; a storage unit that stores software used for causing the arithmetic unit to reconfigure a function relating to an operation of the monitoring target; and a processing unit that reads the software from the storage unit and applies the software to the arithmetic unit in a case in which it is determined by the determination unit that a malfunction has occurred in the monitoring target.

(2): In the aspect (1) described above, in a case in which it is determined by the determination unit that a malfunction has occurred in the monitoring target, the processing unit overwrites the software used for reconfiguring the function relating to the operation of the monitoring target in a memory area of the arithmetic unit on which other software executed by the arithmetic unit in a case in which it is not determined by the determination unit that a malfunction has occurred in the monitoring target is reflected.

(3): In the aspect (2) described above, the arithmetic unit operates on the basis of a plurality of pieces of other software in a case in which it is not determined by the determination unit that a malfunction has occurred in the monitoring target, and, in a case in which the software is overwritten into a memory area used by other software of the arithmetic unit, the processing unit overwrites the software used for reconfiguring the function relating to the operation of the monitoring target in a memory area storing the other software to which a priority level lower than that of the software to be overwritten is set by referring to first priority level information set in the other software.

(4): In the aspect (3) described above, a first priority level setting unit that sets the first priority level information on the basis of the state of the monitoring target is further included.

(5): In the aspect (1) described above, a plurality of pieces of software that are read and are reflected on the arithmetic unit in a case in which it is determined by the determination unit that a malfunction has occurred in the monitoring target are stored in the storage unit, and the processing unit, in a case in which it is determined by the determination unit that a malfunction has occurred in the monitoring target, the processing unit reads software to which a high priority level is set from the storage unit with priority by referring to second priority level information set to the plurality of pieces of software and reflects the read software on the arithmetic unit.

(6): In the aspect (5) described above, a second priority level setting unit that sets the second priority level information on the basis of the state of the monitoring target is further included.

(7): According to one aspect of the present invention, there is provided a control unit that is a control unit including two or more control devices according to claim 1, wherein the monitoring target monitored by each of the control devices is a different control device other than the device itself.

(8): In the aspect (1) described above, the monitoring target is a device that performs vehicle control of an automated driving vehicle, and the software used for reconfiguring the function relating to the operation of the monitoring target is software used for realizing a degeneration function running the automated driving vehicle under restriction.

(9): In the aspect (8) described above, the arithmetic unit operates on the basis of a plurality of different pieces of software in a case in which it is not determined by the determination unit that a malfunction has occurred in the monitoring target, and the processing unit selects software to be called among a plurality of pieces of software stored by the storage unit in accordance with a surrounding situation of the automated driving vehicle.

(10): In the aspect (8) described above, the processing unit reads the software used for reconfiguring the function relating to the operation of the monitoring target from the storage unit in a stepped manner in accordance with a surrounding situation of the automated driving vehicle and reflects the read software on the arithmetic unit.

(11): In the aspect (8) described above, a first priority level setting unit that sets a first priority level of other software performing a process relating to driving control of the automated driving vehicle to be high is further included, wherein, in a case in which the other software is overwritten into a memory area used by an existing function of the arithmetic unit, the processing unit overwrites the software used for reconfiguring the function relating to the operation of the monitoring target into a memory area storing the other software to which a low priority level is set by referring to first priority level information set to the other software.

(12): In the aspect (11) described above, the first priority level setting unit sets the first priority level of the other software operating when the automated driving vehicle is manually driven by a vehicle occupant to be high.

(13): In the aspect (8) described above, a second priority level setting unit that sets a second priority level of software performing a process relating to driving control of the automated driving vehicle to be high by referring to second priority level information set to the software in a case in which the processing unit overwrites software into a memory area used by other software of the arithmetic unit is further included.

(14): In the aspect (13) described above, the second priority level setting unit changes the second priority level of the software on the basis of whether or not the software is used after stopping of the vehicle according to the degeneration function.

(15): In the aspect (13) described above, the second priority level setting unit sets a second priority level of the software not operating when the automated driving vehicle is manually driven by a vehicle occupant of the automated driving vehicle to be low.

(16): In the aspect (7) described above, the monitoring target is a device that performs vehicle control of an automated driving vehicle, and the software used for reconfiguring the function relating to the operation of the monitoring target is software used for realizing a degeneration function running the automated driving vehicle under restriction.

(17): A control method according to one aspect of the present invention is a control method using a computer including: determining whether or not a malfunction has occurred in a monitoring target on the basis of a state of the monitoring target; and reading software used for causing an arithmetic unit capable of reconfiguring a function to reconfigure a function relating to an operation of the monitoring target from a storage unit and reflecting the software on the arithmetic unit in a case in which it is determined that a malfunction has occurred in the monitoring target.

(18): In the aspect (17) described above, the computer operates the arithmetic unit in a state in which other software is reflected on the arithmetic unit until it is determined that a malfunction has occurred in the monitoring target and overwrites software used for reconfiguring the function relating to the operation of the monitoring target into a memory area of the arithmetic unit when it is determined that a malfunction has occurred in the monitoring target.

(19): A storage medium according to one aspect of the present invention, is a (computer-readable non-transitory) storage medium having a program stored thereon, the program causing a computer to execute: determining whether or not a malfunction has occurred in a monitoring target on the basis of a state of the monitoring target; and reading software used for causing an arithmetic unit capable of reconfiguring a function to reconfigure a function relating to an operation of the monitoring target from a storage unit and reflecting the software on the arithmetic unit in a case in which it is determined that a malfunction has occurred in the monitoring target.

According to the aspects (1) to (19), a function dedicated for responding to a malfunction is realized only when a malfunction occurs using a flexible structure of an arithmetic unit that can be reconfigured.

In addition, according to the aspect (2), a predetermined function is not written into the arithmetic unit unless a use condition is satisfied, and accordingly, an optimal arithmetic unit to be mounted in the control device can be selected.

Furthermore, according to the aspects (3) to (4), the sequence of generating a predetermined function can be optimized on the basis of first priority levels, and accordingly, a generation time is shortened, and the predetermined function can be realized in an early stage.

In addition, according to the aspects (5) and (6), the sequence of generating a predetermined function can be optimized on the basis of the second priority levels, and accordingly, a generation time is shortened, and the predetermined function can be realized in an early stage.

In addition, according to the aspects (8) and (15), a degeneration function is generated only in a case in which accuracy of automated driving decreases, and accordingly, degeneration control can be also realized while decreasing the size of the arithmetic unit.

BRIEF DESCRIPTION OF THE DRAWINGS

FIG. 7 is a diagram illustrating one example of a memory use state of the other control device before one control device comes into a malfunctioning state;

FIG. 8 is a diagram illustrating one example of a memory use state of the other control device after one control device comes into a malfunctioning state and after generation of an FOF unit is started;

FIG. 10 is a diagram illustrating a correspondence relation between a second priority level of an FOF unit, which is set by a second priority level setting unit, and the FOF unit;

FIG. 11 is a diagram illustrating one example of a memory use state of the other control device before one control device comes into a malfunctioning state;

FIG. 12 is a diagram illustrating one example of a memory use state of the other control device after one control device comes into a malfunctioning state;

FIG. 13 is a diagram illustrating one example of a memory use state of the other control device after one control device stops the function;

DESCRIPTION OF EMBODIMENTS

Hereinafter, a control device, a control unit, a control method, and a storage medium according to an embodiment of the present invention will be described with reference to the drawings.

<Embodiment>
[Configuration of Control Device]

Figure 1:
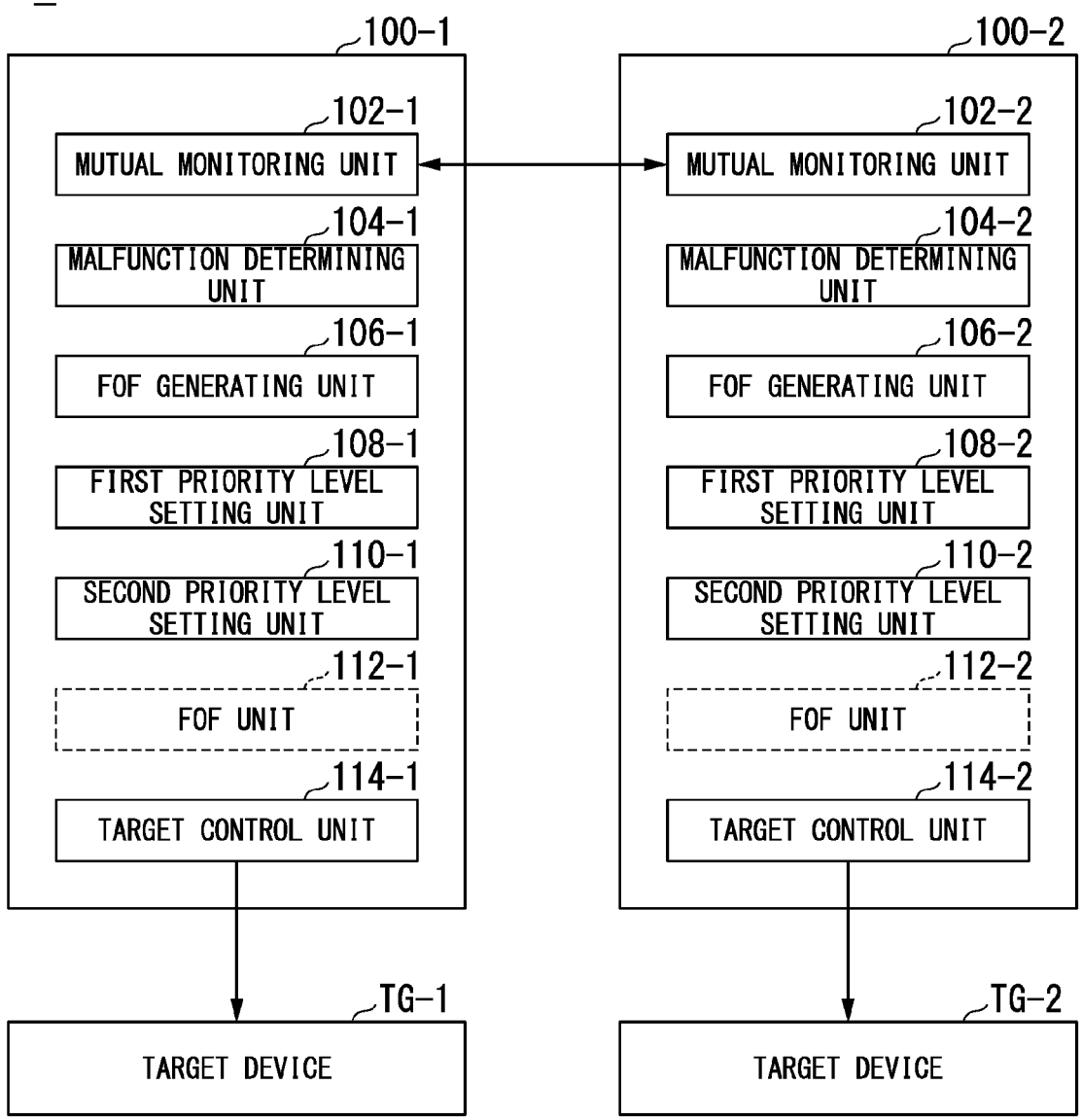
FIG. 1 is a configuration diagram of a control unit formed using two control devices.

FIG. 1 is a configuration diagram of a control unit 1 including a control device 100-1 and a control device 100-2. The control device 100-1 and the control device 100-2 illustrated in FIG. 1, for example, respectively perform processes relating to control processes of a target device TG-1 and a target device TG-2 that are control targets. The target device TG-1 and the target device TG-2 may be devices of separate bodies or devices of an integrated body. In the latter case, the target device TG-1 and the target device TG-2 perform control processes for different functions of the same device. In description of FIG. 1, a hyphen and a subsequent number included in each reference sign represent a certain control device to which the component corresponds. In addition, a hyphen and a subsequent number may be omitted in description as is appropriate.

The control unit 1 includes two or more control devices 100. Each of two or more control devices 100 monitors whether the other control devices 100 are operating stably. Two or more control devices 100 may have the same function, or some functions thereof may be different from each other. Two or more control devices 100 have mutual complementary functions such that a control target can be securely controlled by the other control devices 100 even in a case in which each of two or more control devices 100 has some functions different from the other control devices 100 and in a case in which a certain control device 100 is withdrawn due to a malfunction or the like.

The control unit 1, for example, may employ a redundant configuration in a hot standby form or a redundant configuration in a cold standby form or may perform load balance through a load sharing device.

In addition, in the following description, it is assumed that a memory area of a field programmable gate array (FPGA) to be described later in the control device 100 is effectively utilized for controlling a control target and does not have a sufficient spare capacity (available capacity).

The control device 100, for example, includes a mutual monitoring unit 102, a malfunction determining unit 104, a fail operational function (FOF) generating unit 106, a first priority level setting unit 108, a second priority level setting unit 110, an FOF unit 112, and a target control unit 114.

The mutual monitoring unit 102 transmits/receives a heartbeat message including information informing that its own device is operating normally (or information for checking that the other party is operating normally) to/from another control device 100 at a predetermined interval, whereby operation states thereof are monitored. Data representing a part or all of the control processing results acquired by the control device 100 may be included in a heartbeat message. In such a case, the mutual monitoring unit 102 may mutually check data of the control processing results. The mutual monitoring unit 102 outputs a result of transmission/reception of the heartbeat message to the malfunction determining unit 104.

The malfunction determining unit 104 determines whether or not another control device 100 has malfunctioned on the basis of a result of reception of a heartbeat message from another control device 100 using the mutual monitoring unit 102. For example, in a case in which a heartbeat message has not been consecutively received a predetermined number of times (for example, several times) or more from another control device 100, the malfunction determining unit 104 may determine that another control device 100 is in a malfunctioning state. In a case in which it is determined that another control device 100 is in a malfunctioning state, the malfunction determining unit 104 outputs information representing an indication thereof to the FOF generating unit 106, the first priority level setting unit 108, and the second priority level setting unit 110.

The FOF generating unit 106 reads a program realizing an FOF function from the storage unit 300 in accordance with a signal output by the malfunction determining unit 104 and expands the read program in a memory area of the FPGA included in the control device 100, thereby generating the FOF unit 112. The FOF is a dedicated function for performing a countermeasure relating to a defect of the control device 100 and, for example, is a function for realizing fail-safe by temporarily stopping a target device TG or causing a display unit of the target device TG to display a warning for prompting repair or exchange. The FOF may be realized by a single piece of software or may be realized by software for each of a plurality of functions by preparing software for each of the functions. In a case in which the FOF is realized by software for each of a plurality of functions, the FOF is realized by selectively reading software appropriate for the situation of a surrounding environment from an external storage device in accordance with the state of the surrounding environment of a control target.

In the following description, a function of realizing an FOF may be referred to as a "degeneration function". Here, the FOF generating unit 106 is one example of a "processing unit," and the FOF unit 112 is one example of an element realized by "software for reconfiguring a function relating to an operation of a monitoring target."

When a plurality of FOF units 112 are generated by the FOF generating unit 106, the first priority level setting unit 108 sets a priority level for generation. The first priority level setting unit 108 outputs the set priority level to the FOF generating unit 106. The first priority level setting unit 108 may set a first priority level in advance or set a first priority level immediately before the process of the FOF generating unit 106 starts. The first priority level setting unit 108, for example, may set degrees of priority represented using consecutive values or stepped degrees of priority of "high, intermediate, and low" as first priority levels or may set first priority levels as priority rankings.

In order to secure a memory capacity required for the process of generating the FOF unit 112 using the FOF generating unit 106, the second priority level setting unit 110 sets a priority level of an existing function that is used as a determination material when a work memory area is collected from an existing function included in the control device 100 or a memory secured by an existing function is collected. The second priority level setting unit 110 outputs the set priority level to the FOF generating unit 106. The second priority level setting unit 110 may set a second priority level in advance or set a second priority level immediately before the process of the FOF generating unit 106 starts. Similar to the first priority level setting unit 108, the second priority level setting unit 110, for example, may set degrees of priority represented using consecutive values or stepped degrees of priority of "high, intermediate, and low" as second priority levels or may set second priority levels as priority rankings.

In addition, only one of the first priority level setting unit 108 and the second priority level setting unit 110 may be included in the control device 100, or both thereof may be omitted.

The target control unit 114 performs control relating to the target device TG of the control device 100. In a case in which the FOF unit 112 is generated by the FOF generating unit 106, there is a possibility that the target control unit 114 will not be realized.

The FOF unit 112 and the target control unit 114 are realized on an FPGA (one example of an arithmetic unit that can be reconfigured) included in the control device 100. The FOF unit 112 is a function reflected on the control device 100 only when a malfunction occurs in another control device 100 and does not function at a normal time. For example, in a case in which a malfunction of another control device 100 that is a monitoring target is detected, the FOF unit 112 is generated by being overwritten into a part of a memory area, in which it will be expanded, of the target control unit 114 and functions until the another control device 100 is repaired or replaced.

[FOF Generation]

Hereinafter, the procedure of generating the FOF unit 112 will be described. In the following description, as other functions realized on the control device 100 of which a part or all of a memory area used by the FOF unit 112 is collected, for convenience of description, a target control unit 114-1A will be referred to as a "function A," a target control unit 114-1B will be referred to as a "function B," a target control unit 114-1C will be referred to as a "function C," and a target control unit 114-1D will be referred to as a "function D."

Figure 2:
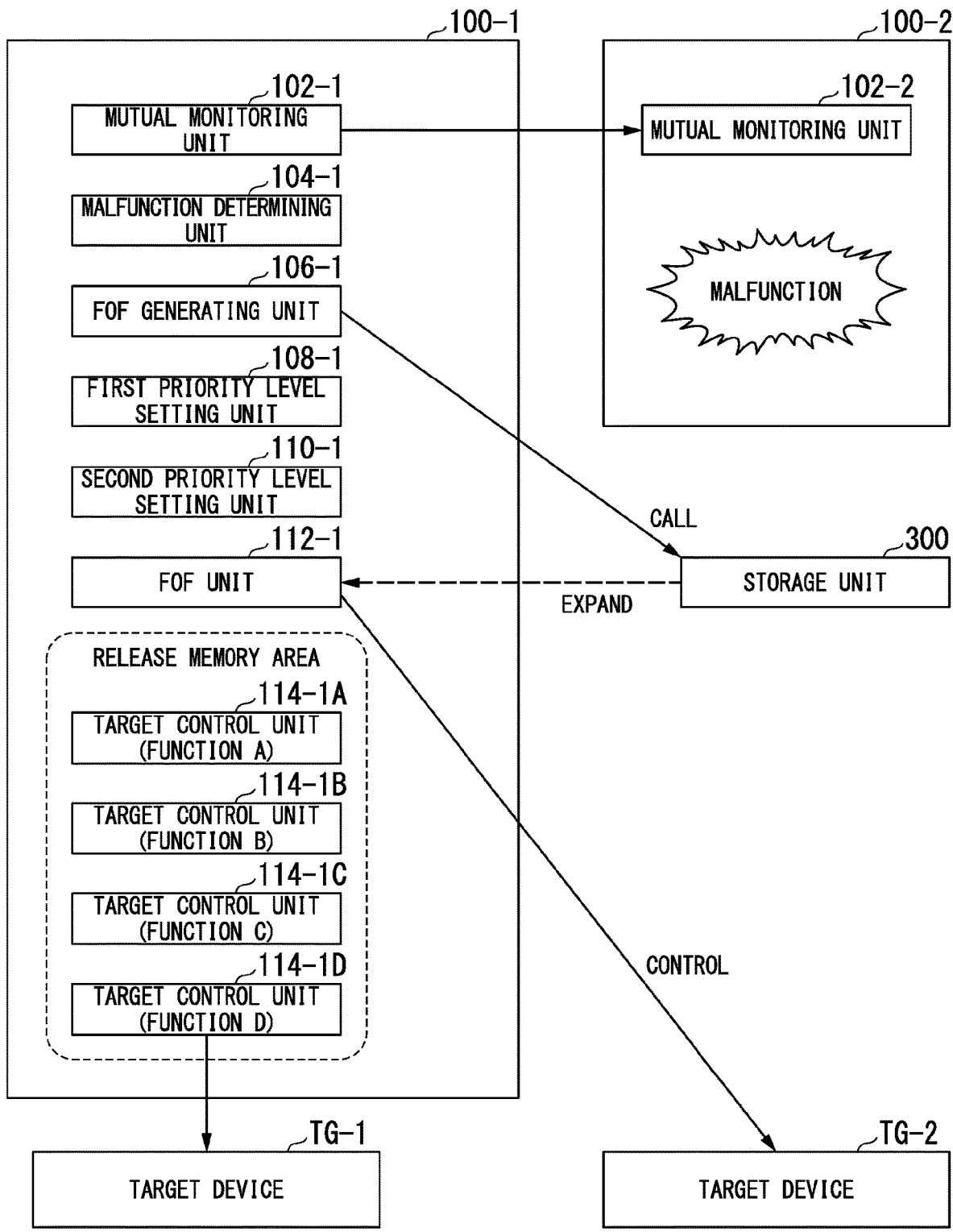
FIG. 2 is a configuration of a control unit in a case in which one control device is in a malfunctioning state.

FIG. 2 is a functional overview diagram of the control unit 1 at a timing at which the control device 100-1 determines the control device 100-2 to be in a malfunctioning state. In a case in which the control device 100-2 is determined to be in a malfunctioning state by the malfunction determining unit 104-1 of the control device 100-1, the FOF generating unit 106-1 calls source information (for example, a file in which software is compressed and stored) configuring the FOF from the storage unit 300 and stores the source information in the control device 100-1. The storage unit 300 may be a storage device such as a flash memory or a hard disk drive (HDD) or may be an external server that can communicate with a control target of the control device 100.

As described above, there is no spare memory capacity in the control device 100-1, and accordingly, the FOF unit 112 cannot be generated unless the memory area is adjusted by the FOF generating unit 106. Accordingly, the FOF generating unit 106-1 secures a memory capacity for generating the FOF unit 112-1 by releasing a part of or all of the memory area used for other functions (for example, the target control units 114-1A to 114-1C not executing control). At that time, the FOF generating unit 106-1 determines a function for releasing the memory and a proportion of the memory to be released on the basis of a first priority level of other function set by the first priority level setting unit 108-1 and performs partial reconfiguration using the released memory area, thereby generating the FOF unit 112-1. Here, the partial reconfiguration dynamically resets the function while causing the process of a part of the FPGA (for example, the released memory area) to be continuously executed without stopping the function of the remaining FPGA (for example, the target control unit 114-1D for which control is being executed). In addition, the FOF generating unit 106-1 may generate the FOF unit 112-1 on the basis of a second priority level set by the second priority level setting unit 110-1.

[Comparative Example of Control Unit]

Figures 3, 4, 5:
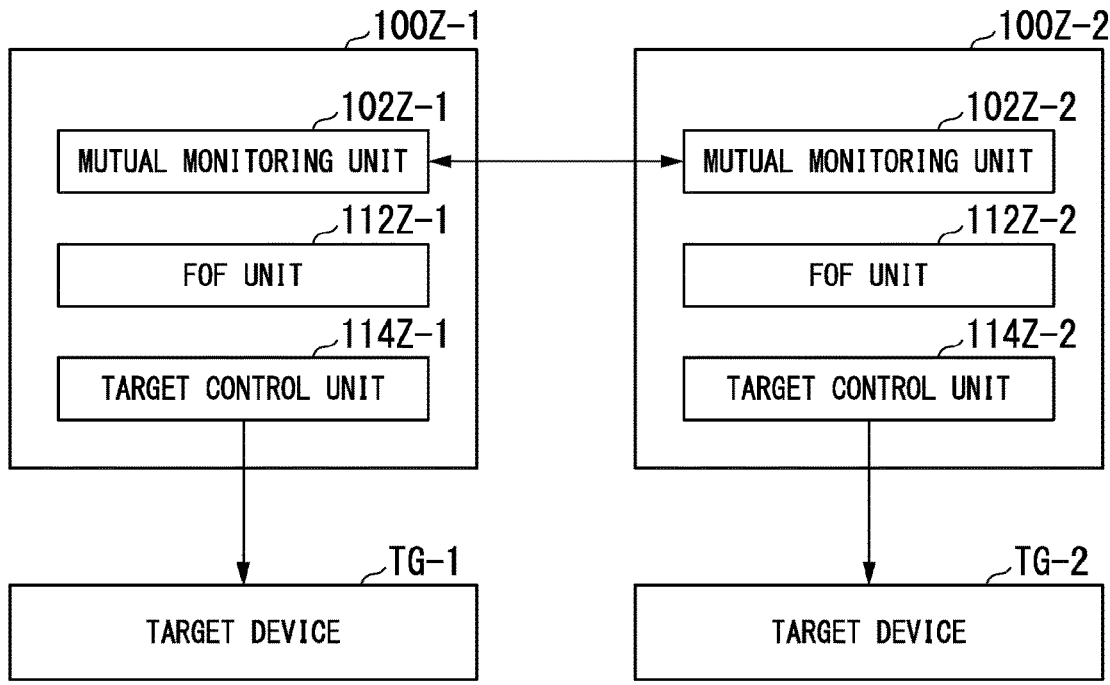
FIG. 3 is a configuration diagram of a conventional control unit.
FIG. 4 is a diagram illustrating one example of a memory use state of the other control device before one control device comes into a malfunctioning state.
FIG. 5 is a diagram illustrating one example of a memory use state of the other control device after one control device comes into a malfunctioning state.

FIG. 3 is a diagram illustrating a configuration diagram of a control unit 1Z of a comparative example. The control unit 1Z of the comparative example is formed by a control device 100Z-1 and a control device 100Z-2. The control device 100Z includes a mutual monitoring unit 102Z, a target control unit 114Z, and an FOF unit 112Z. As illustrated in FIG. 3, in a case in which the FOF unit 112Z is disposed in the control device 100Z in advance, it is necessary to secure a memory area storing the FOF unit 112Z even at a normal time.

In a case in which the control unit 1Z performs a process of a high load controlling a target device TG, it is assumed that a memory area required to be allocated to the target control unit 114Z increases. In such a case, it is preferable to improve the process performance of the target control unit 114Z by allocating as much memory area that can be used by the target control unit 114Z as possible. However, it is necessary to always have a memory area storing the FOF unit 112Z secured, and the use status of the memory area that can be used by the target control unit 114Z may be regarded as being inefficient. Alternatively, in order to store the FOF unit 112Z in the control device 100Z and increase the process efficiency of the target control unit 114Z, there is a possibility that a user using the control device 100Z may increase the size of the arithmetic unit mounted in the control device 100Z of the control unit 1Z.

Compared to the control device 100Z, the control device 100 according to this embodiment can use an efficient arithmetic unit that allocates as much memory area that can be used by the target control unit 114 as possible at a normal time and generates the FOF unit 112 only at a time of malfunction. In addition, a user using the control device 100 can select a smaller device as an optimal device on which the control device 100 is mounted in accordance with the process amount of the control device 100 at a normal time.

[Generation of FOF with First Priority Level Taken into Account]

Hereinafter, a rule of setting the first priority level using the first priority level setting unit 108 will be described with reference to FIGS. 4 and 5. In the following description, the target control unit (function A) 114-1A, the target control unit (function B) 114-1B, the target control unit (function C) 114-1C, and the target control unit (function D) 114-1D illustrated in FIG. 2 are used. In the following description, for convenience of description, the target control unit 114-1A will be referred to as a "function A," the target control unit 114-1B will be referred to as a "function B," the target control unit 114-1C will be referred to as a "function C," and the target control unit 114-1D will be referred to as a "function D."

FIG. 4 is a diagram illustrating one example of a use status of a memory area of an FPGA of the control device 100-1 before the control device 100-2 comes into a malfunctioning state. FIG. 4 illustrates use statuses of the memory area of the FPGA according to the function A, the function B, the function C, and the function D before it is determined that the control device 100-2 is in a malfunctioning state and a priority ranking is set for each function by the first priority level setting unit 108 for each function. At a timing illustrated in FIG. 4, all the memory areas of the FPGA are used in accordance with the function A, the function B, the function C, and the function D. The first priority level setting unit 108, for example, sets priority rankings in order of highest to lowest usage proportion of the memory area of each function and sets a priority ranking "1" to the function A, sets a priority ranking "2" to the function B, sets a priority ranking "3" to the function C, and sets a priority ranking "4" to the function D.

FIG. 5 is a diagram illustrating one example of a use status of a memory area of an FPGA of a control device 100-1 after a control device 100-2 comes into a malfunctioning state. As illustrated in FIG. 5, in a case in which 50[%] of the memory area of the FPGA is required for configuring the FOF unit 112, the FOF generating unit 106 selects a function that is a target for securing a memory area on the basis of priority levels set by the first priority level setting unit 108. In the example illustrated in FIG. 5, the FOF generating unit 106 secures a memory area required for the FOF unit 112 by gradually releasing all the memory areas from all the functions. The FOF generating unit 106, as illustrated in FIG. 5, secures a memory area required for the FOF unit 112 by releasing a memory area allocated to its own function with a higher proportion than from a function having a lower priority ranking. For example, the function A having a priority ranking "1" of which a memory area usage proportion is 40[%] in a state illustrated in FIG. 4 may be set to a memory area usage proportion of 30[%] as illustrated in FIG. 5, and the FOF generating unit 106 releases ¼ of the original memory area. In addition, the function D having a priority ranking "4" of which a memory area usage proportion is 10[%] in the state illustrated in FIG. 4 may be set to a memory area usage proportion of 1[%] as illustrated in FIG. 5, and the FOF generating unit 106 releases 9/10 of the original memory area. In this way, the FOF generating unit 106 adjusts a memory area to be released for each function in accordance with the priority ranking.

Figure 6:
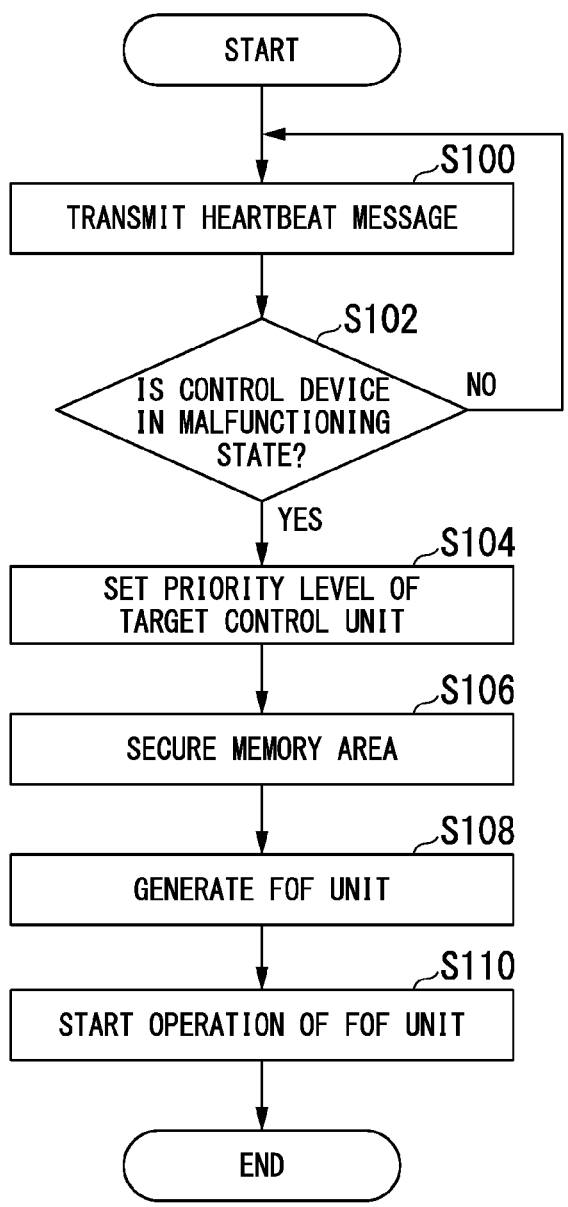
FIG. 6 is a flowchart illustrating one example of the flow of a process of generating an FOF unit on the basis of a first priority level using an FOF generating unit.

Hereinafter, the flow of a process of generating the FOF unit 112 using the FOF generating unit 106 will be described with reference to FIG. 6. FIG. 6 is a flowchart illustrating one example of the flow of a process of generating the FOF unit 112 using the FOF generating unit 106. Description of the following flowchart will be described as a process using the control device 100-1 having the configuration illustrated in FIG. 2.

First, the mutual monitoring unit 102-1 transmits a heartbeat message to a control device 100-2 that is a monitoring target (Step S100). Next, the malfunction determining unit 104-1 determines whether or not the control device 100-2 is in a malfunctioning state on the basis of whether or not there is a response from the control device 100-2 that is the monitoring target (Step S102). In a case in which it is not determined that the control device 100-2 is in a malfunctioning state, the malfunction determining unit 104-1 returns the process to Step S100 again after a predetermined time elapses. On the other hand, in a case in which it is determined that the control device 100-2 is in a malfunctioning state, the malfunction determining unit 104-1 causes the first priority level setting unit 108-1 to set a priority level of the target control unit 114-1 (Step S104).

Next, the FOF generating unit 106-1 secures a memory area on the basis of the priority level set by the first priority level setting unit 108-1 (Step S106) and generates an FOF unit 112-1 (Step S108). The FOF generating unit 106-1 starts the operation of the generated FOF unit 112-1 and starts the process (Step S110). The description of the process of this flowchart has been presented as above.

[Another Rule of First Priority Level Setting]

Here, another setting rule for priority levels using the first priority level setting unit 108 will be described with reference to FIGS. 7 and 8. FIG. 7 is a diagram illustrating another example of a use status of a memory area of an FPGA of the control device 100-1 before the control device 100-2 comes into a malfunctioning state. When compared to FIG. 4, a status field representing a use status (active or inactive) of the function is added in FIG. 7. In FIG. 7, the first priority level setting unit 108 sets one of "high," "intermediate," and "low" to each function as a priority level. For example, the first priority level setting unit 108 sets a priority "high" to a function A. In the example illustrated in FIG. 7, it is assumed that a function B and a function D are executing the process (active), and the function A and a function C are not executing the process (inactive).

FIG. 8 is a diagram illustrating another example of a use status of a memory area of an FPGA of a control device 100-1 after a control device 100-2 comes into a malfunctioning state. As illustrated in FIG. 8, in a case in which 50[%] of the memory area of the FPGA is required for configuring the FOF unit 112, the FOF generating unit 106 selects a function that is a target for securing a memory area on the basis of priority levels set by the first priority level setting unit 108 and a status. In the example illustrated in FIG. 8, the FOF generating unit 106 releases memory areas from the function A and the function C that are not executing a prioritized process. At this time, the FOF generating unit 106, as illustrated in FIG. 8, may release all the memory areas of the function C or may also set an area in which a program for realizing the function C is stored as a release target. The reason for this is that the FOF generating unit 106 determines that there is no functioning of the function C until repair of the control device 100-2 is completed in accordance with the functioning of the FOF unit 112. On the other hand, for memory areas of the function A, different from the function C, the FOF generating unit 106 maintains some of the memory areas to be allocated. The reason for this is that there is a difference between the function A having a priority level of "high" and the function C having a priority level of "intermediate."

In a case in which memory areas released from the function A and the function C are smaller than a memory area required for the generation of the FOF unit 112, the FOF generating unit 106 releases memory areas also from the function B and the function D executing processes. However, even in a case in which the FOF unit 112 is generated, for a function minimally required for control of a target device TG (for example, a function that is necessarily realized when a manual operation is performed), the FOF generating unit 106 neither releases all the memory areas nor deletes the function.

Figure 9:
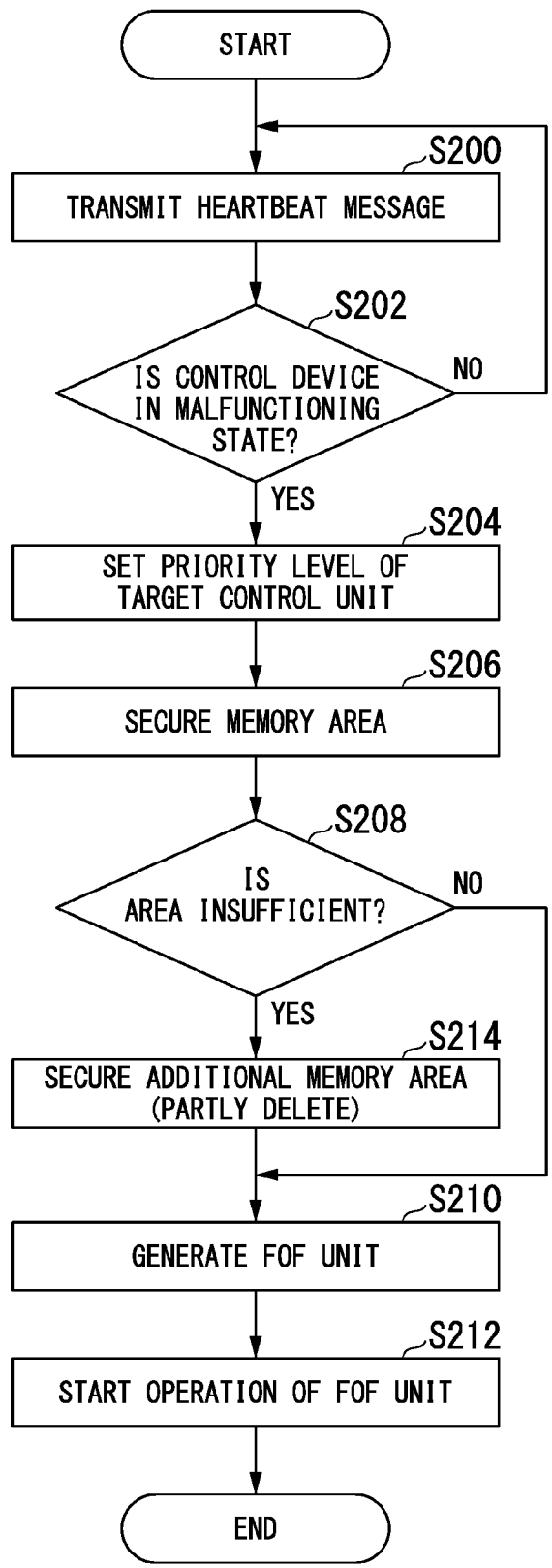
FIG. 9 is a flowchart illustrating one example of the flow of a process of generating an FOF unit on the basis of a second priority level using an FOF generating unit.

FIG. 9 is a flowchart illustrating another example of the flow of the process of generating an FOF unit 112 using the FOF generating unit 106. Steps S200 and S202 illustrated in FIG. 9 respectively correspond to Steps S100 and S102 illustrated in FIG. 6, Step S206 corresponds to Step S106 illustrated in FIG. 6, and Steps S210 and S212 respectively correspond to Steps S108 and S110 illustrated in FIG. 6. For this reason, Steps S204, S208, and S214 will be focused upon in the following description.

In a case in which a malfunctioning state is determined in Step S202, the FOF generating unit 106 sets a first priority level of the target control unit 114 (Step S204).

After the process of Step S208, the FOF generating unit 106 determines whether or not a memory area for generating an FOF unit 112 is still in an insufficient state (Step S208).

In a case in which it is determined that the memory area is still insufficient, the FOF generating unit 106 further releases a memory area from the target control unit 114. (Step S214). On the other hand, in a case in which it is not determined that the memory area is still insufficient, the FOF generating unit 106 causes the process to proceed to Step S212. As above, the process of this flowchart has been described.

[Generation of FOF with Second Priority Level Taken into Account]

Hereinafter, a rule for setting a second priority level using the second priority level setting unit 110 and a process performed in a case in which the FOF generating unit 106 adjusts a timing at which an FOF unit 112 is generated by referring to the second priority level will be described. In the following example, as illustrated in FIG. 2, it will be described that the control device 100-2 of the control unit 1 comes into a malfunctioning state, and the control device 100-1 performs control using a degeneration function of the target device TG by generating an FOF unit 112. Also in the following description, the description will be presented using the target control unit (the function A) 114-1A, the target control unit (the function B) 114-1B, the target control unit (the function C) 114-1C, and the target control unit (the function D) 114-1D illustrated in FIG. 2.

FIG. 10 is a diagram illustrating a correspondence relation between a second priority level of an FOF unit 112 that is set by the second priority level setting unit 110 and the FOF unit 112. For example, in a case in which the second priority level is set in a stepped manner as "high, intermediate, and low," it is assumed that the second priority level setting unit 110 sets a second priority level of "high" to a function 1 of the FOF unit 112 and sets a second priority level of "low" to a function 2.

FIG. 11 is a diagram illustrating one example of a memory use state of the control device 100-1 before the control device 100-2 comes into a malfunctioning state. In a stage illustrated in FIG. 11, in the control device 100-1, the function A for a target device TG performs an emergency control function, and 70[%] of the memory area is used. The emergency control function, for example, is a function performing control for temporary stop or safety checking of a target device TG and is control not to be stopped in the middle. In addition, in the stage illustrated in FIG. 11, while the function B, the function C, and the function D for the target device TG perform control functions in the control device 100-1, it is assumed that there is no problem even when the functions stop in the middle.

At a timing illustrated in FIG. 11, the control device 100-1 of the control unit 1 determines that the control device 100-2 is in the malfunctioning state, and the remaining memory areas of the control device 100-1 are used by the function B, the function C, and the function D. In the use status described above, the first priority level setting unit 108 sets a first priority level of "high" to the function A and sets a first priority level of "low" to the function B, the function C, and the function D.

At this time, the FOF generating unit 106 uses 70[%] of the memory area of the FPGA on the basis of the use status of the target device TG and determines to generate two functions (a function 1 and a function 2) as FOF units 112. The FOF generating unit 106 selects to release memory areas from the function B, the function C, and the function D of which the first priority levels are low for generating an FOF unit 112 by referring to first priority levels set by the first priority level setting unit 108. In addition, since a memory area to be released is 30[%] at the maximum, the FOF generating unit 106, first, generates the function 1 of the FOF unit 112 and determines to generate the function 2 of the FOF unit 112 when an emergency control function ends.

FIG. 12 is a diagram illustrating one example of a memory use state of the control device 100-1 after the control device 100-2 comes into a malfunctioning state. The FOF generating unit 106 gradually releases memory areas from the function B, the function C, and the function D, starts to generate the function 1 of the FOF unit 112, and allocates the memory areas released from the function B, the function C, and the function D. At this timing, the control of the function A ends.

FIG. 13 is a diagram illustrating one example of a memory use state of the control device 100-1 after the control device 100-2 comes into a malfunctioning state and after the generation of the FOF unit 112 is started. The FOF generating unit 106 releases a memory area used by the function A, generates the functions 1 and 2 of the FOF unit 112, and starts processes thereof. At this time, when there is a spare in the memory area, the FOF generating unit 106, as illustrated in FIG. 13, may allocate the memory area to the target control unit 114 (the function B, the function C, and the function D) or may additionally allocate the memory area to the FOF unit 112.

In addition, in a case in which there is an FOF unit 112 to be further generated and in a case in which the FOF unit 112 that has already been generated ends a process according to the function thereof, and there is no performance of a similar process again, the FOF generating unit 106 may delete the FOF unit 112 that has already been generated and generate a new FOF unit 112.

[Flowchart]

Figure 14:
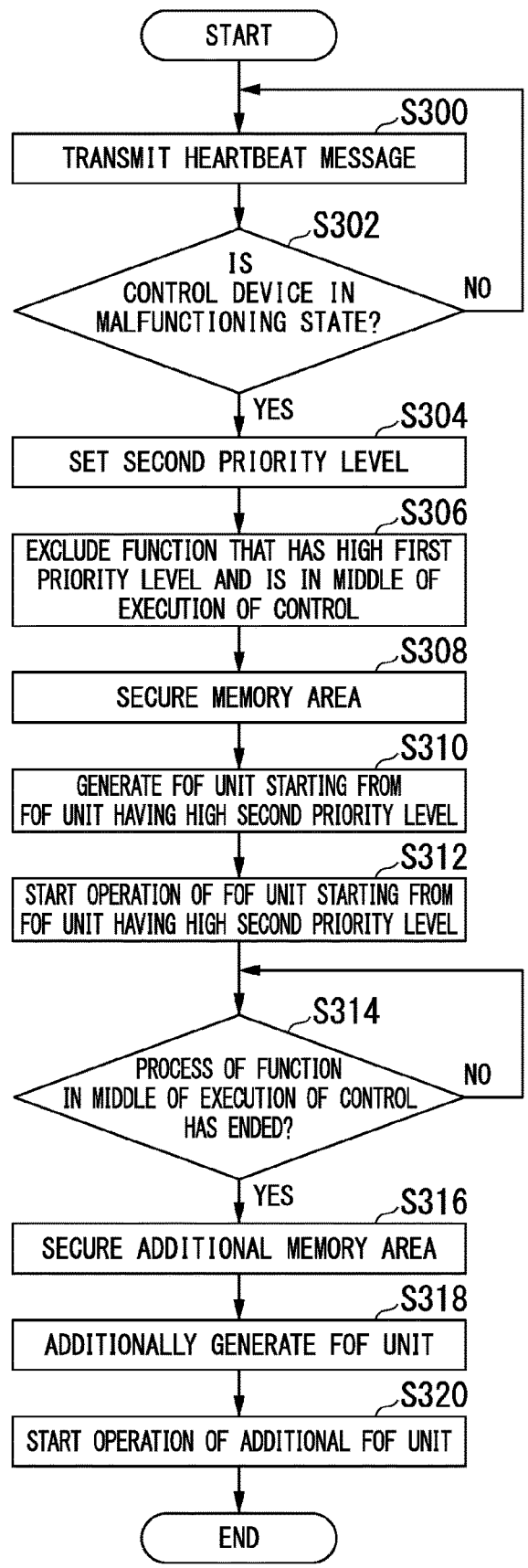
FIG. 14 is a flowchart illustrating one example of the flow of a process of generating an FOF unit using an FOF generating unit.

FIG. 14 is a flowchart illustrating one example of the flow of a process of generating an FOF unit 112 using the FOF generating unit 106 by referring to first priority levels. Steps S300 and S302 illustrated in FIG. 14 correspond to Steps S100 and S102 illustrated in FIG. 6. For this reason, Step S304 and subsequent steps will be described below.

In a case in which a malfunctioning state is determined in the process of Step S302, the malfunction determining unit 104 causes the second priority level setting unit 110 to set a second priority level of each function of the FOF unit 112 (Step S304). Next, the FOF generating unit 106 excludes a function that has a high first priority level and is realized by the target control unit 114 of which control is executing from memory area release targets (Step S306). Next, the FOF generating unit 106 secures memory areas from functions other than the function excluded in Step S306 (Step S308) and starts to generate an FOF unit starting from the FOF unit 112 having a high second priority level (Step S310). Next, the function of the FOF unit 112 having the high second priority level that has been generated first is started to operate (Step S312).

Next, the FOF generating unit 106 determines whether or not a function realized by the target control unit 114 for which control is executing has ended a process (Step S314). In a case in which it is determined that the process has ended, the FOF generating unit 106 secures an additional memory area (Step S316) and starts to additionally generate an FOF unit 112 (Step S318). The FOF generating unit 106 starts the operation of the function of the FOF unit 112 of which additional generation has been completed (Step S320). The description of the process of this flowchart has been presented as above.

In addition, the FOF unit 112 may cite a function by appropriately calling the target control unit 114. In such a case, a high first priority level is set to the target control unit 114 cited by the FOF unit 112. In a case in which the FOF unit 112 cites a function by calling the target control unit 114, the FOF unit 112 may be configured in a stepped manner in accordance with the function of the cited target control unit 114. For example, in a case in which a function of the target control unit 114 relating to generation of temperature control of the target device TG is consecutively cited, the FOF generating unit 106 may cause the generated FOF unit 112 not to have a function of generating temperature control.

[Hardware Configuration]

Figure 15:
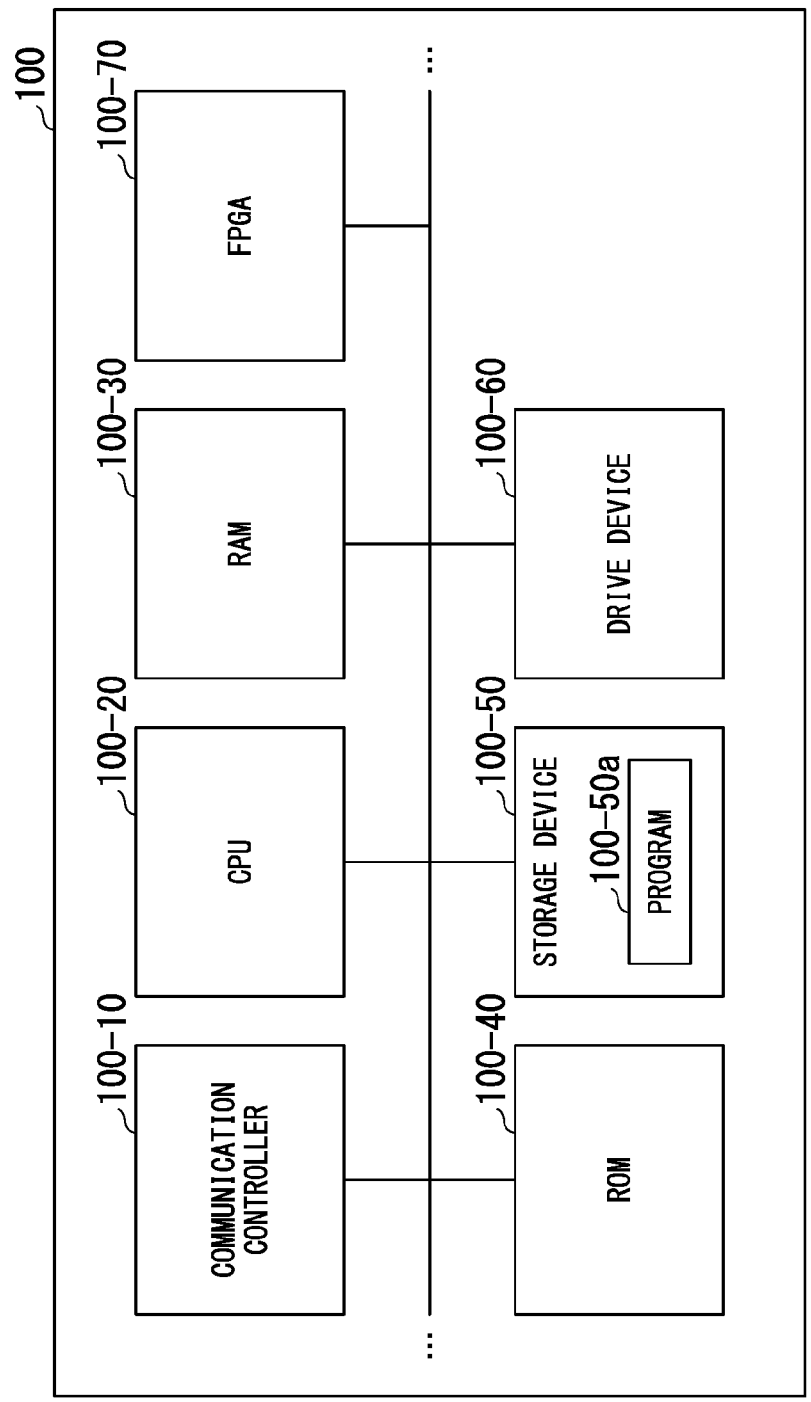
FIG. 15 is a diagram illustrating one example of the hardware configuration of a control device according to an embodiment.

FIG. 15 is a diagram illustrating one example of the hardware configuration of the control device 100 mounted in a vehicle control device 5. In description of FIG. 15, a hyphen and subsequent numbers in a reference sign represent a constituent element of the control device 100. As illustrated in the drawing, the control device 100 has a configuration in which a communication controller 100-10, a CPU 100-20, a random access memory (RAM) 100-30 used as a working memory, a read only memory (ROM) 100-40 storing a boot program and the like, a storage device 100-50 such as a flash memory or an HDD, a drive device 100-60, an FPGA 100-70, and the like are interconnected through an internal bus or a dedicated communication line. The communication controller 100-10 communicates with constituent elements other than the control device 100. A program 100-50a executed by the CPU 100-2 is stored in the storage device 100-50. This program is expanded in the RAM 100-30 on the FPGA 100-70 using a direct memory access (DMA) controller (not illustrated in the drawing) or the like and is executed by the CPU 100-20. In this way, a recognition unit 130 and an action plan generating unit 140 are realized.

The embodiment described above can be represented as below.

A control device including a storage device storing a program and a hardware processor and configured such that the hardware processor, by executing the program stored in the storage device, determines whether or not a malfunction has occurred in a monitoring target on the basis of a state of the monitoring target, in a case in which it is determined that a malfunction has occurred in the monitoring target, reads software used for causing an arithmetic unit, which can reconfigure the function, to reconfigure a function relating to an operation of the monitoring target, and reflects the reconfiguration on the arithmetic unit.

According to the first embodiment described above, by including the malfunction determining unit 104 that determines whether or not a malfunction has occurred in a monitoring target on the basis of a state of the monitoring target, the storage unit 300 storing the FOF unit 112 for reconfiguring a function relating to an operation of the monitoring target in an FPGA that can reconfigure the function, and the FOF generating unit 106 that generates the FOF unit 112 in a case in which it is determined that a malfunction has occurred in the monitoring target by the malfunction determining unit 104, the FOF unit 112 dedicatedly responding to a malfunction only at the time of occurrence of the malfunction can be realized using a flexible structure of the FPGA that can be reconfigured.

In addition, according to the control device 100 of the first embodiment, the FPGA can be used only for control of the target control unit 114 at a normal time, and accordingly, effective use of the arithmetic unit in which a memory area that can be used by the target control unit 114 is allocated as much as possible at a normal time, the FOF unit 112 is generated only at a malfunctioning time can be performed, and an optimal device mounting the control device 100 can be selected in accordance with the amount of processing of the control device 100 at a normal time.

Furthermore, according to the control device 100 of the first embodiment, the sequence of generating FOF units 112 can be optimized on the basis of first priority levels according to the first priority level setting unit 108 and/or second priority levels according to the second priority level setting unit 110, a generation time is shortened, and control using the FOF unit 112 can be realized in an early stage.

APPLICATION EXAMPLE

Hereinafter, application examples of the embodiment will be described. In this examples, it is assumed that a control target for a control unit (control device) is a device that is mounted in an automated driving vehicle M.

[Entire Configuration at the Time of Vehicle Control]

Figure 16:
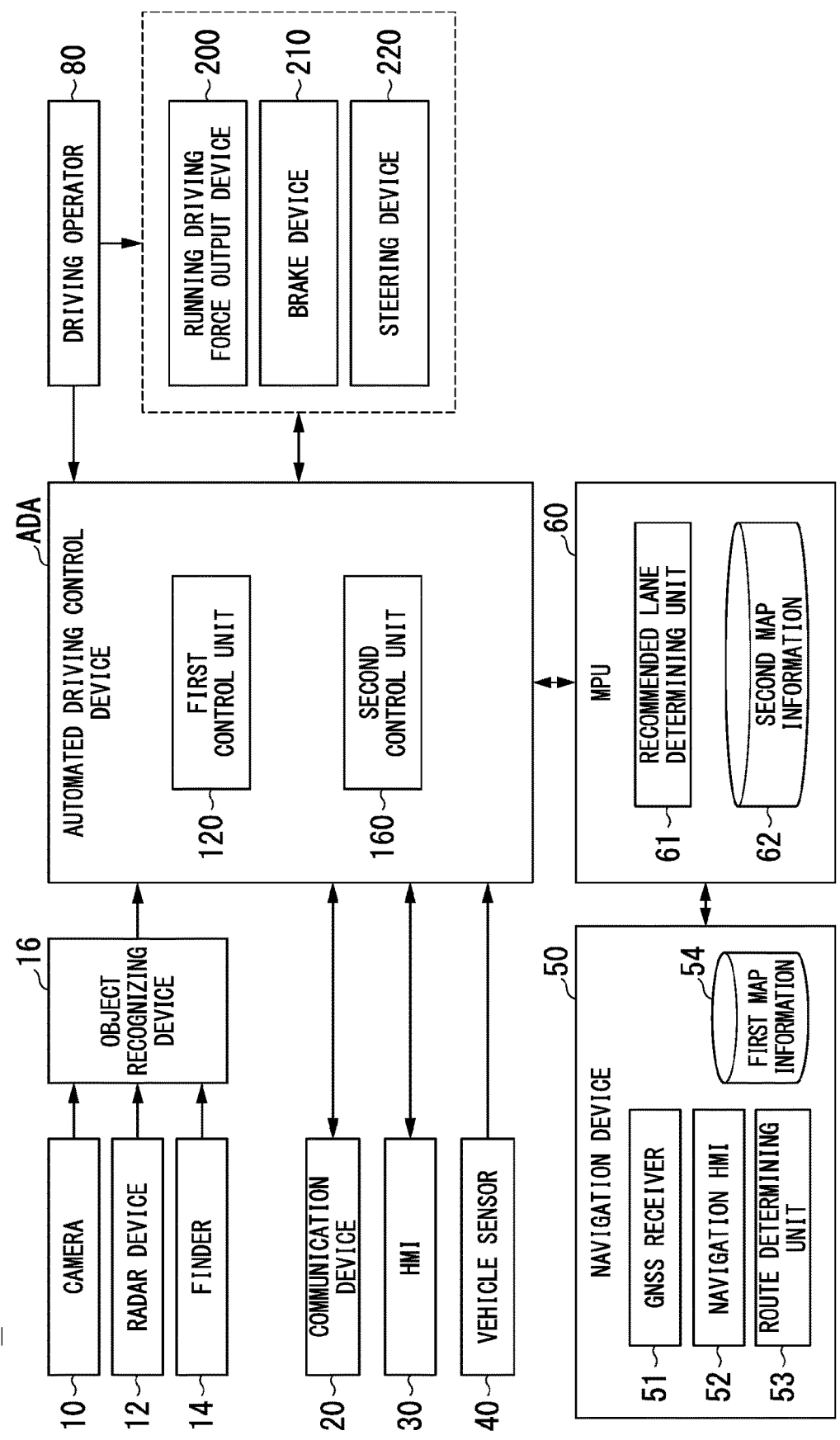
FIG. 16 is a configuration diagram of a vehicle control device including a control unit (control device) according to an embodiment.

FIG. 16 is a configuration diagram of a vehicle control device 5 including a control unit (control device) according to an embodiment. A vehicle in which the vehicle control device 5 is mounted is, for example, a vehicle having two wheels, three wheels, four wheels, or the like, and a driving source thereof is an internal combustion engine such as a diesel engine or a gasoline engine, an electric motor, or a combination thereof. The electric motor operates using power generated using a power generator connected to an internal combustion engine or power discharged from a secondary cell or a fuel cell.

The vehicle control device 5, for example, includes a camera 10, a radar device 12, a finder 14, an object recognizing device 16, a communication device 20, a human machine interface (HMI) 30, a vehicle sensor 40, a navigation device 50, a map positioning unit (MPU) 60, a driving operator 80, an automated driving control device ADA, a running driving force output device 200, a brake device 210, and a steering device 220. Such devices and units are interconnected using a multiplex communication line such as a controller area network (CAN) communication line, a serial communication line, a radio communication network, or the like. The configuration illustrated in FIG. 16 is merely one example, and thus parts of the configuration may be omitted or other additional components may be added.

The camera 10, for example, is a digital camera using a solid-state imaging device such as a charge coupled device (CCD) or a complementary metal oxide semiconductor (CMOS). The camera 10 is installed at an arbitrary place on a vehicle in which the vehicle control device 5 is mounted (hereinafter referred to as an automated driving vehicle M). In the case of forward imaging, the camera 10 is installed on an upper part of a front windshield, a rear face of a rear-view mirror, or the like. The camera 10, for example, repeatedly images the vicinity of the automated driving vehicle M periodically. The camera 10 may be a stereo camera.

The radar device 12 emits radio waves such as millimeter waves to the vicinity of the automated driving vehicle M and detects at least a position of (a distance to and an azimuth of) an object by detecting radio waves (reflected waves) reflected by the object. The radar device 12 is installed at an arbitrary place on the automated driving vehicle M. The radar device 12 may detect a position and a speed of an object using a frequency modulated continuous wave (FM-CW) system.

The finder 14 is a light detection and ranging (LIDAR) device. The finder 14 emits light to the vicinity of the automated driving vehicle M and measures scattered light. The finder 14 detects a distance with respect to a target on the basis of a time from light emission to light reception. The emitted light, for example, is pulse-form laser light. The finder 14 is mounted at an arbitrary position on the automated driving vehicle M.

The object recognizing device 16 may perform a sensor fusion process on results of detection using some or all of the camera 10, the radar device 12, and the finder 14, thereby allowing recognition of a position, a type, a speed, and the like of an object. The object recognizing device 16 outputs a result of recognition to the automated driving control device ADA. The object recognizing device 16 may output results of detection using the camera 10, the radar device 12, and the finder 14 to the automated driving control device ADA as they are. The object recognizing device 16 may be omitted from the vehicle control device 5.

The communication device 20, for example, communicates with other vehicles present in the vicinity of the automated driving vehicle M using a cellular network, a Wi-Fi network, Bluetooth (registered trademark), dedicated short range communication (DSRC), or the like or communicates with various server apparatuses through a radio base station.

The HMI 30 presents various types of information to a vehicle occupant of the automated driving vehicle M and receives an input operation performed by the vehicle occupant. The HMI 30 includes various display devices, a speaker, a buzzer, a touch panel, switches, keys, and the like.

The vehicle sensor 40 includes a vehicle speed sensor that detects a speed of the automated driving vehicle M, an acceleration sensor that detects an acceleration, a yaw rate sensor that detects an angular velocity around a vertical axis, an azimuth sensor that detects the azimuth of the automated driving vehicle M, and the like.

The navigation device 50, for example, includes a global navigation satellite system (GNSS) receiver 51, a navigation HMI 52, and a route determining unit 53. The navigation device 50 stores first map information 54 in a storage device such as a hard disk drive (HDD) or a flash memory. The GNSS receiver 51 identifies a position of an automated driving vehicle M on the basis of signals received from GNSS satellites. The position of the automated driving vehicle M may be identified or complemented by an inertial navigation system (INS) using an output of the vehicle sensor 40. The navigation HMI 52 includes a display device, a speaker, a touch panel, a key, and the like. A part or the whole of the navigation HMI 52 and the HMI 30 described above may be configured to be shared. The route determining unit 53, for example, determines a route to a destination input by a vehicle occupant using the navigation HMI 52 (hereinafter referred to as a route on a map) from a position of the automated driving vehicle M identified by the GNSS receiver 51 (or an input arbitrary position) by referring to the first map information 54. The first map information 54, for example, is information in which a road form is represented by respective links representing roads and respective nodes connected using the links. The first map information 54 may include a curvature of each road, point of interest (POI) information, and the like. The route on the map is output to the MPU 60. The navigation device 50 may perform route guidance using the navigation HMI 52 on the basis of the route on the map. The navigation device 50, for example, may be realized by a function of a terminal device such as a smartphone or a tablet terminal held by a vehicle occupant. The navigation device 50 may transmit a current location and a destination to a navigation server through the communication device 20 and acquire a route equivalent to the route on the map received from the navigation server.

The MPU 60, for example, includes a recommended lane determining unit 61 and stores second map information 62 in a storage device such as an HDD or a flash memory. The recommended lane determining unit 61 divides the route on the map provided from the navigation device 50 into a plurality of blocks (for example, divides the route into blocks of 100 [m] in the advancement direction of the vehicle) and determines a recommended lane for each block by referring to the second map information 62. The recommended lane determining unit 61 determines one of lanes numbered from the left side to run. In a case in which there is a branching place in the route on the map, the recommended lane determining unit 61 determines a recommended lane such that the automated driving vehicle M can run along a reasonable route for advancement to a branching destination.

The second map information 62 is map information having higher accuracy than the first map information 54. The second map information 62, for example, includes information on the centers of respective lanes, information on boundaries between lanes, or the like. In addition, in the second map information 62, road information, traffic regulation information, address information (addresses and postal codes), facility information, telephone number information, and the like may be included. The second map information 62 may be updated as needed by the communication device 20 communicating with another device.

The driving operator 80, for example, includes an acceleration pedal, a brake pedal, a shift lever, a steering wheel, a steering wheel variant, a joystick, and other operators. A sensor detecting the amount of an operation or the presence/absence of an operation is installed in the driving operator 80, and a result of the detection is output to the automated driving control device (vehicle control device) ADA or some or all of the running driving force output device 200, the brake device 210, and the steering device 220.

The automated driving control device ADA, for example, includes a first control unit 120 and a second control unit 160. In the automated driving control device ADA, the first control unit 120 is an application example of the control device 100-1 according to the embodiment described above, and the second control unit 160 is an application example of the control device 100-2 according to the embodiment described above. The application destinations are not limited thereto, and the application destinations may be determined such that an application destination of the control device 100-1 is the recognition unit 130 included in the first control unit 120, and an application destination of the control device 100-2 is the action plan generating unit 140. Other than that, the control device 100-1 and the control device 100-2 may be applied to arbitrary constituent elements among the constituent elements of the vehicle control device 5 illustrated in FIG. 16 or 17. A combination of the control device 100-1 and the control device 100-2 that have been applied is the control unit 1.

Figure 17:
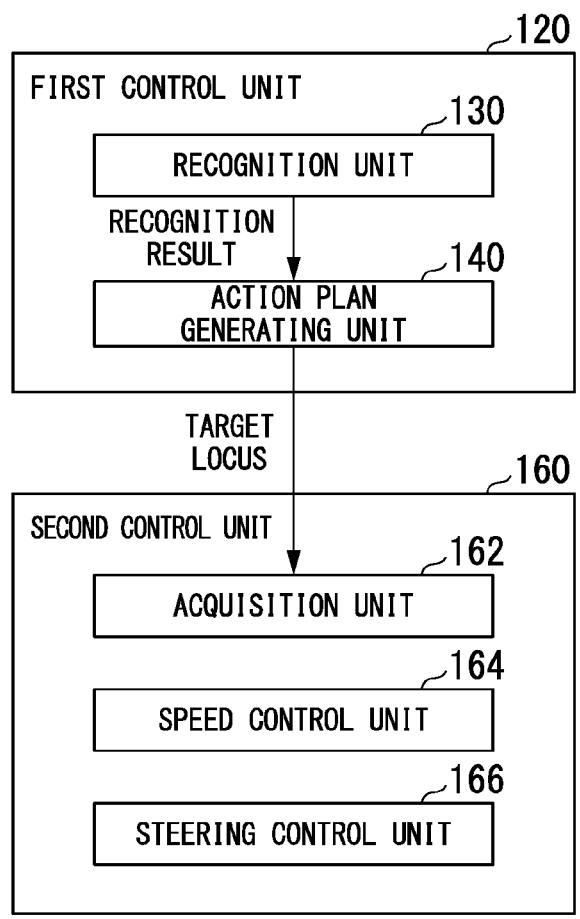
FIG. 17 is a configuration diagram of an automated driving control device.

FIG. 17 is a configuration diagram of the automated driving control device ADA. The first control unit 120, for example, includes a recognition unit 130 and an action plan generating unit 140. Each of the first control unit 120 and the second control unit 160, for example, is realized by a hardware processor such as a central processing unit (CPU) executing a program (software). Some or all of these constituent elements may be realized by hardware (a circuit unit; including circuitry) such as a large scale integration (LSI), an application specific integrated circuit (ASIC), a field-programmable gate array (FPGA), or a graphics processing unit (GPU) or may be realized by software and hardware in cooperation. The program may be stored in a storage device such as a hard disk drive (HDD) or a flash memory of the automated driving control device ADA in advance or may be stored in a storage medium such as a DVD or a CD-ROM that can be loaded or unloaded and installed in an HDD or a flash memory of the automated driving control device ADA by loading the storage medium into a drive device.

The first control unit 120, for example, realizes both a function according to artificial intelligence and a function according to a model given in advance. The first control unit 120, for example, simultaneously realizes functions using artificial intelligence (AI) and functions using a model provided in advance. For example, a function of "recognizing an intersection" may be realized by executing recognition of an intersection using deep learning or the like and recognition based on conditions given in advance (a traffic light, road markings, and the like that can be used for pattern matching are present) at the same time and comprehensively evaluating both recognitions by assigning scores to them. Accordingly, the reliability of automated driving is secured.

The recognition unit 130, for example, includes a surrounding situation recognizing unit 132, an object recognizing unit 134, a traffic scene selecting unit 136, and a text generating unit 138. The surrounding situation recognizing unit 132 recognizes states such as a position, orientation, a speed, an acceleration, and the like of each object present in the vicinity of the automated driving vehicle M on the basis of information input from the camera 10, the radar device 12, and the finder 14 through the object recognizing device 16. The position of an object, for example, is recognized as a position in an absolute coordinate system having a representative point (the center of gravity, the center of a driving shaft, or the like) of the automated driving vehicle M as its origin and is used for control. The position of an object may be represented as a representative point such as the center of gravity or a corner of an object or may be represented in a represented area. A "state" of the object may include an acceleration, a jerk, or an "action state" (for example, whether or not the object is changing lanes or is to change lanes) of an object.

The action plan generating unit 140 automatically (without depending on a driver's operation) generates a target locus along which the automated driving vehicle M will run in the future such that the subject vehicle basically can run on a recommended lane determined by the recommended lane determining unit 61 and can respond to a surrounding situation of the automated driving vehicle M. The target locus, for example, includes a speed element. For example, the target locus is represented as a sequence in which places (locus points) at which the automated driving vehicle M will arrive are sequentially aligned. A locus point is a place at which the automated driving vehicle M will arrive at respective predetermined running distances (for example, about every several [m]) as distances along the road, and separately from that, a target speed and a target acceleration for each of predetermined sampling times (for example, a fraction of a [sec]) are generated as a part of the target locus. A locus point may be a position at which the automated driving vehicle M will arrive at a predetermined sampling time for each of the sampling time. In such a case, information of a target speed or a target acceleration is represented using intervals between the locus points.

When a target locus is generated, the action plan generating unit 140 may set an event of automated driving. As events of automated driving, there are a constant-speed running event, a low-speed running-behind event, a lane change event, a branching event, a merge event, an overtaking event, and the like. The action plan generating unit 140 generates a target locus according to operated events.

The second control unit 160 performs control of the running driving force output device 200, the brake device 210, and the steering device 220 such that the automated driving vehicle M passes along a target locus generated by the action plan generating unit 140 at a scheduled time.

The second control unit 160, for example, includes an acquisition unit 162, a speed control unit 164, and a steering control unit 166. The acquisition unit 162 acquires information of a target locus (locus points) generated by the action plan generating unit 140 and stores the target locus information in a memory (not illustrated). The speed control unit 164 controls the running driving force output device 200 or the brake device 210 on the basis of a speed element accompanying the target locus stored in the memory. The steering control unit 166 controls the steering device 220 in accordance with a degree of curvature of the target locus stored in the memory. The processes of the speed control unit 164 and the steering control unit 166, for example, are realized by a combination of feed forward control and feedback control. For example, the steering control unit 166 may execute feed forward control according to the curvature of a road in front of the automated driving vehicle M and feedback control based on a deviation from the target locus in combination.

The running driving force output device 200 outputs a running driving force (torque) used for a vehicle to run to driving wheels. The running driving force output device 200, for example, includes a combination of an internal combustion engine, an electric motor, a transmission, and the like and an ECU controlling these components. The ECU controls the components described above in accordance with information input from the second control unit 160 or information input from the driving operator 80.

The brake device 210, for example, includes a brake caliper, a cylinder that delivers hydraulic pressure to the brake caliper, an electric motor that generates hydraulic pressure in the cylinder, and a brake ECU. The brake ECU performs control of the electric motor in accordance with information input from the second control unit 160 or information input from the driving operator 80 such that a brake torque according to a brake operation is output to each vehicle wheel. The brake device 210 may include a mechanism delivering hydraulic pressure generated in accordance with an operation on the brake pedal included in the driving operators 80 to the cylinder through a master cylinder as a backup. The brake device 210 is not limited to the configuration described above and may be an electronically-controlled hydraulic brake device that delivers hydraulic pressure in the master cylinder to a cylinder by controlling an actuator in accordance with information input from the second control unit 160.

The steering device 220, for example, includes a steering ECU and an electric motor. The electric motor, for example, changes the direction of the steering wheel by applying a force to a rack and pinion mechanism. The steering ECU changes the direction of the steering wheel by driving an electric motor in accordance with information input from the second control unit 160 or information input from the driving operator 80.

Application Example 1 for Vehicle Control Device

As described above, in the vehicle control device 5, for example, the second control unit 160 is realized by the control device 100-1, and the first control unit 120 is realized by the control device 100-2. In a case in which a malfunction has occurred in the control device 100-2, for example, the control device 100-1 gradually decelerates the automated driving vehicle M and stops the automated driving vehicle M.

Hereinafter, referring back to FIG. 7, a setting rule used for setting first priority levels using the first priority level setting unit 108 of the vehicle control device 5 will be described. In the example illustrated in FIG. 7, the function A is a function for controlling a collision reduction brake of the automated driving vehicle M, the function B is a function for supporting lane keeping of the automated driving vehicle M, the function C is a function for supporting lane change of the automated driving vehicle M, and the function D is a function for controlling the vehicle cabin of the automated driving vehicle M. In FIGS. 16 and 17, functional units for realizing such individual functions are not illustrated.

For example, in a case in which a control target of the automated driving control device ADA is the automated driving vehicle M, the FOF unit 112 realizes functions for running the automated driving vehicle M under restriction such as a function relating to contacting a dealer, a maintenance factory, or the like regarding a malfunction of the automated driving vehicle M, a function regarding temporary stop in a road side strip, and a function relating to sending of a vehicle occupant to a dealer, a maintenance factory, or the like. The FOF unit 112 may be realized by the automated driving control device ADA or may be a function operating through manual driving of a vehicle occupant.

Also in a case in which the FOF unit 112 is generated, the FOF generating unit 106 neither releases all the memory areas nor delete a program of each function for a function that is minimally required for control of the automated driving vehicle M and a function required when manual driving according to a vehicle occupant of the automated driving vehicle M is performed (for example, collision reduction braking of the function A).

The FOF generating unit 106 may determine that the function D is caused not to function in a case in which the automated driving vehicle M is in the middle of unmanned running or on the basis of surrounding environments such as temperature of the automated driving vehicle M, the climate, and the like and release the memory area on the basis of a result of the determination. In a case in which the function D performs control such as air conditioning of the automated driving vehicle M and in a case in which the automated driving vehicle M is in the middle of unmanned running, the FOF generating unit 106 determines that release of a memory area including deletion of the function D may be performed. On the other hand, in a case in which the function D performs control such as air conditioning of the automated driving vehicle M and in a case in which a child and an elderly person are included in a vehicle occupant of the automated driving vehicle M, the FOF generating unit 106 determines not to perform release of a memory area including deletion of the function D.

In addition, in a case in which the automated driving vehicle M performs control relating to a running event such as obstacle detouring control, the FOF generating unit 106 adjusts a timing at which the FOF unit 112 is generated in accordance with the event.

For example, the recognition unit 130 of the automated driving vehicle M recognizes an obstacle on the front side in the running direction of the automated driving vehicle M and causes the action plan generating unit 140 to set an obstacle detouring event, and the action plan generating unit 140 generates a running locus for detouring the obstacle. In a case in which a malfunction of another control device 100 has been detected by the control device 100 immediately after the occurrence of the obstacle detouring event described above, the FOF generating unit 106 may delay the timing at which the FOF unit 112 is generated. The FOF generating unit 106, for example, sets the timing at which the FOF unit 112 is generated to a timing after the end of the obstacle detouring event.

Application Example 2 for Vehicle Control Device

Hereinafter, referring back to FIG. 10, a setting rule for setting second priority levels using the second priority level setting unit 110 of the vehicle control device 5 will be described. In the example illustrated in FIG. 10, a function 1 is a function of temporarily stopping the automated driving vehicle M on a roadside or the like, and a function 2 is a function of preparing repair/replacement of the automated driving control device ADA by contacting a dealer or a repair factory of the automated driving vehicle M and moving the automated driving vehicle M to the dealer or the repair factory through automated driving or manual driving.

In a case in which a malfunction of another control device 100 is detected by the control device 100, the second priority level setting unit 110, first, temporarily stops the automated driving vehicle M on a roadside or the like and prepares repair/replacement by contacting a dealer or a repair factor, and thus sets a second priority level to the function 1 of the FOF unit 112 that is higher than that of the function 2.

In addition, in a case in which temporary stopping of the automated driving vehicle M according to the function 1 of the FOF unit 112 ends, in a case in which, after repair/replacement is prepared by contacting a dealer or the like according to the function 2 of the FOF unit 112, the automated driving vehicle M is moved to a repair factory or the like, it is assumed to perform manual driving when the automated driving vehicle M is moved to the repair factory, and accordingly, the second priority level setting unit 110 sets the second priority level of the function 2 of the FOF unit 112 to be higher than the first priority level. In addition, in a case in which there is a function operating at the time of manual driving (for example, the function 2) in the FOF unit 112, the second priority level setting unit 110 sets the second priority level of the function to be high and sets the second priority level of a function not operating at the time of manual driving (for example, the function 1) to be low.

As described above, according to the vehicle control device 5, vehicle control of the automated driving vehicle M that is a monitoring target is performed, and the FOF unit 112 that is software for realizing a degeneration function for running the automated driving vehicle M under restriction can realize a dedicated function responding to a malfunction only at the time of occurrence of a malfunction using a flexible structure of the FPGA that can be reconfigured.

In addition, according to the vehicle control device 5, an FOF unit 112 that is a degeneration function is generated only in a case in which the accuracy of automated driving decreases, and accordingly, degeneration control can be also realized while decreasing the size of the control device 100.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A control device comprising:
a processor; and
a memory storing software that causes reconfiguration of a function relating to an operation of a monitoring target,
the processor being configured to:
determine whether or not a malfunction has occurred in the monitoring target on the basis of a state of the monitoring target;
reconfigure a function; and
read the software from the memory and apply the software in reconfiguring the function in a case in which it is determined that a malfunction has occurred in the monitoring target,
wherein, in a case in which it is determined by the processor that a malfunction has occurred in the monitoring target, the processor is configured to overwrite the software used for reconfiguring the function relating to the operation of the monitoring target in a memory area of the processor on which other software, executed by the processor in a case in which it is not determined by the processor that a malfunction has occurred in the monitoring target, is reflected,
wherein the processor is configured to operate on the basis of a plurality of pieces of other software in a case in which it is not determined by the processor that a malfunction has occurred in the monitoring target, and
wherein, in a case in which the software is overwritten into a memory area used by other software of the processor, the processor is configured to overwrite the software used for reconfiguring the function relating to the operation of the monitoring target in a memory area storing the other software to which a priority level lower than that of the software to be overwritten is set by referring to first priority level information set in the other software.

2. The control device according to claim 1, the processor further being configured to set the first priority level information on the basis of the state of the monitoring target.

3. The control device according to claim 1,
wherein a plurality of pieces of software that are read and are reflected on the processor in a case in which it is determined by the processor that a malfunction has occurred in the monitoring target are stored in the memory, and
wherein the processor, in a case in which it is determined by the processor that a malfunction has occurred in the monitoring target, the processor is configured to read software to which a high priority level is set from the memory with priority by referring to second priority level information set to the plurality of pieces of software and reflects the read software on the processor.

4. The control device according to claim 3, the processor further being configured to set the second priority level information on the basis of the state of the monitoring target.

5. A control unit including two or more of the control devices according to claim 1,
wherein the monitoring target monitored by each of the control devices is a control device different from the control devices.

6. The control device according to claim 1,
wherein the monitoring target is a device that performs vehicle control of an automated driving vehicle, and
wherein the software used for reconfiguring the function relating to the operation of the monitoring target is software used for realizing a degeneration function running the automated driving vehicle under restriction.

7. The control device according to claim 6,
wherein the processor is configured to operate on the basis of a plurality of different pieces of software in a case in which it is not determined by the processor that a malfunction has occurred in the monitoring target, and
wherein the processor is configured to select software to be called among a plurality of pieces of software stored by the memory in accordance with a surrounding situation of the automated driving vehicle.

8. The control device according to claim 6, wherein the processor is configured to read the software used for reconfiguring the function relating to the operation of the monitoring target from the memory in a stepped manner in accordance with a surrounding situation of the automated driving vehicle and reflects the read software on the processor.

9. The control device according to claim 6, the processor further being configured to set a first priority level of other software performing a process relating to driving control of the automated driving vehicle to be high,
wherein, in a case in which the other software is overwritten into a memory area used by an existing function of the processor, the processor is configured to overwrite the software used for reconfiguring the function relating to the operation of the monitoring target into a memory area storing the other software to which a low priority level is set by referring to first priority level information set to the other software.

10. The control device according to claim 9, wherein the processor is configured to set the first priority level of the other software operating when the automated driving vehicle is manually driven by a vehicle occupant to be high.

11. The control device according to claim 6, the processor further being configured to set a second priority level of software performing a process relating to driving control of the automated driving vehicle to be high by referring to second priority level information set to the software in a case in which the processor overwrites the software into a memory area used by other software of the processor.

12. The control device according to claim 11, wherein the processor is configured to change the second priority level of the software on the basis of whether or not the software is used after stopping of the vehicle according to the degeneration function.

13. The control device according to claim 11, wherein the processor is configured to set a second priority level of the software not operating when the automated driving vehicle is manually driven by a vehicle occupant of the automated driving vehicle to be low.

14. The control unit according to claim 5,
wherein the monitoring target is a device that performs vehicle control of an automated driving vehicle, and
wherein the software used for reconfiguring the function relating to the operation of the monitoring target is software used for realizing a degeneration function running the automated driving vehicle under restriction.

15. A control method using a computer, the control method comprising:
determining whether or not a malfunction has occurred in a monitoring target on the basis of a state of the monitoring target; and in a case in which it is determined that a malfunction has occurred in the monitoring target, overwriting the software used for reconfiguring the function relating to the operation of the monitoring target in a memory area of the arithmetic unit on which other software, executed by the arithmetic unit in a case in which it is not determined that a malfunction has occurred in the monitoring target, is reflected, and in a case in which the software is overwritten into a memory area used by other software of the arithmetic unit, overwriting the software used for reconfiguring the function relating to the operation of the monitoring target in a memory area storing the other software to which a priority level lower than that of the software to be overwritten is set by referring to first priority level information set in the other software.

16. The control method using the computer according to claim 15, further comprising:

operating the arithmetic unit in a state in which other software is reflected on the arithmetic unit until it is determined that a malfunction has occurred in the monitoring target, and overwriting software used for reconfiguring the function relating to the operation of the monitoring target into a memory area of the arithmetic unit when it is determined that a malfunction has occurred in the monitoring target.

17. A computer-readable non-transitory storage medium having a program stored thereon, the program causing a computer to execute:

determining whether or not a malfunction has occurred in a monitoring target on the basis of a state of the monitoring target; and in a case in which it is determined that a malfunction has occurred in the monitoring target, overwriting the software used for reconfiguring the function relating to the operation of the monitoring target in a memory area of the arithmetic unit on which other software, executed by the arithmetic unit in a case in which it is not determined that a malfunction has occurred in the monitoring target, is reflected, and in a case in which the software is overwritten into a memory area used by other software of the arithmetic unit, overwriting the software used for reconfiguring the function relating to the operation of the monitoring target in a memory area storing the other software to which a priority level lower than that of the software to be overwritten is set by referring to first priority level information set in the other software.

* * * * *